US008037446B2

(12) United States Patent
Futrell et al.

(10) Patent No.: US 8,037,446 B2
(45) Date of Patent: Oct. 11, 2011

(54) METHODS FOR DEFINING EVALUATION POINTS FOR OPTICAL PROXIMITY CORRECTION AND OPTICAL PROXIMITY CORRECTION METHODS INCLUDING SAME

(75) Inventors: John R. C. Futrell, Boise, ID (US); Ezequiel Vidal Russell, Boise, ID (US); William A. Stanton, Hillsboro, OR (US)

(73) Assignee: Micron Technology, Inc., Boise, ID (US)

(*) Notice: Subject to any disclaimer, the term of this patent is extended or adjusted under 35 U.S.C. 154(b) by 568 days.

(21) Appl. No.: 12/174,171

(22) Filed: Jul. 16, 2008

(65) Prior Publication Data

US 2010/0017778 A1    Jan. 21, 2010

(51) Int. Cl.
G06F 17/50    (2006.01)

(52) U.S. Cl. ........ 716/136; 716/126; 716/132; 716/139; 703/14

(58) Field of Classification Search .................. 716/126, 716/132, 136, 139
See application file for complete search history.

(56) References Cited

U.S. PATENT DOCUMENTS

| | | | |
|---|---|---|---|
| 6,245,468 B1 | 6/2001 | Futrell et al. | |
| 6,319,644 B2 | 11/2001 | Pierrat et al. | |
| 6,374,396 B1 | 4/2002 | Baggenstoss et al. | |
| 6,447,961 B2 | 9/2002 | Futrell et al. | |
| 6,563,127 B2 | 5/2003 | Lin et al. | |
| 6,807,519 B2 | 10/2004 | Stanton | |
| 7,003,756 B2 | 2/2006 | Zhang | |
| 7,003,757 B2 | 2/2006 | Pierrat et al. | |
| 7,082,596 B2 | 7/2006 | Lin | |
| 7,096,452 B2 | 8/2006 | Alvarez-Gomariz et al. | |
| 7,131,101 B2 | 10/2006 | Pierrat et al. | |
| 7,245,356 B2 * | 7/2007 | Hansen | 355/67 |
| 7,247,574 B2 | 7/2007 | Broeke et al. | |
| 7,276,315 B2 | 10/2007 | Stanton et al. | |
| 7,283,205 B2 | 10/2007 | Mackey et al. | |
| 2001/0023043 A1 | 9/2001 | Futrell et al. | |
| 2002/0004714 A1 | 1/2002 | Jones et al. | |
| 2003/0061587 A1 | 3/2003 | Zhang et al. | |
| 2006/0248496 A1 | 11/2006 | Sezginer et al. | |
| 2007/0006118 A1 | 1/2007 | Pierrat et al. | |
| 2007/0277145 A1 | 11/2007 | Scaman | |

OTHER PUBLICATIONS

Aoyagi et al., Precise Patterning Technique for Nb Junctions Using Optical Proximity Correction, IEEE Transactions on Applied Superconductivity, vol. 11, No. 1, arch 2001, pp. 381-384.

* cited by examiner

Primary Examiner — Thuan Do
(74) Attorney, Agent, or Firm — TraskBritt

(57) ABSTRACT

Methods are disclosed for defining evaluation points for use in optical proximity correction of a rectangular target geometry. A method for defining evaluation points for use in optical proximity correction of a rectangular target geometry may comprise predicting a contour of an image to be produced in an optical proximity correction simulation of a target geometry. The target geometry may comprise a plurality of line segments, each line segment of the plurality having one evaluation point defined thereon. The method may further comprise shifting at least one evaluation point to an associated point on the predicted contour of the image.

13 Claims, 8 Drawing Sheets

US 8,037,446 B2

METHODS FOR DEFINING EVALUATION POINTS FOR OPTICAL PROXIMITY CORRECTION AND OPTICAL PROXIMITY CORRECTION METHODS INCLUDING SAME

TECHNICAL FIELD

Embodiments of the present invention relate to the field of semiconductor fabrication. More particularly, embodiments of the present invention relate to methods of defining evaluation points for optical proximity correction of a pattern in a radiation-patterning process.

BACKGROUND

Photolithography is commonly used during the fabrication of integrated circuits on semiconductor wafers and other bulk substrates comprising a layer of semiconductor material. During photolithography, a form of radiant energy is passed through a radiation-patterning tool onto a radiation-sensitive material, commonly referred to as photoresist, which is placed upon a surface of a semiconductor wafer. The radiation-patterning tool is commonly known as a photomask or reticle.

Radiation-patterning tools contain light-restrictive regions and light-transmissive regions. Light-restrictive regions may be, for example, opaque or partially light transmissive. The light-transmissive regions or portions of a radiation-patterning tool, in conjunction with the light-restrictive regions, cooperatively facilitate the formation of a desired pattern on a semiconductor wafer. For the formation of patterns on a semiconductor wafer, the wafer is coated with a layer of radiation-sensitive material (e.g., photoresist). Subsequently, radiation passes through the radiation-patterning tool onto the layer of photoresist and transfers onto the photoresist a pattern defined by the radiation-patterning tool. Using a form of a photographic process, the photoresist is then developed to remove either the portions exposed to the radiant energy in the case of a "positive" photoresist or the unexposed portions when a "negative" photoresist is utilized. The residual photoresist pattern thereafter serves as a mask for a subsequent semiconductor fabrication process.

With advances in semiconductor integrated circuit processes, the dimensions associated with integrated circuit device features have decreased. Furthermore, the demand for smaller and faster-performing semiconductor devices requires increasing precision and accuracy in photolithographic processes.

FIG. 1 illustrates an apparatus 114 in which a radiation-patterning tool is utilized for a patterning process. Apparatus 114 comprises a radiation source 116 that generates radiation 118 and further includes a radiation-patterning tool 120 through which radiation 118 is passed. A semiconductor wafer or substrate 122 includes a radiation-sensitive layer 124 thereon. As illustrated, radiation 118 passes through radiation-patterning tool 120 and impacts radiation-sensitive layer 124 to form a pattern. This process of forming a pattern on a radiation-sensitive material with a radiation-patterning tool is commonly referred to as a printing process.

Radiation-patterning tool 120 typically includes an obscuring material that may either be an opaque (e.g., chrome) or a semi-opaque material placed over a transparent material (e.g., glass). Radiation-patterning tool 120 is illustrated in FIG. 1 as having a front side 128 for forming features or windows and an opposing back side 126. Some radiation-patterning tools further utilize both the front side and back side for the formation of windows. Radiation-patterning tool 120 typically has a pattern with dimensions on the order of, or smaller than, the wavelength of radiation passing through the radiation-patterning tool. Therefore, interference effects may occur when radiation passes through the radiation-patterning tool and exits onto the radiation-sensitive material. Accordingly, the pattern, and more specifically, geometries within the pattern of the radiation-patterning tool must be modified to compensate for such interference effects. For example, a resolution enhancement technique (RET), such as optical proximity correction may be employed to modify the pattern on the photomask or reticle to optimize the shape of the light focused on the photoresist.

FIG. 2 illustrates a flow chart of a conventional optical proximity correction process used in creating a pattern for a radiation-patterning tool. Initially, a preliminary design is created and verified 110 with a desired pattern identified to form the target pattern on the photoresist. Subsequently, profiles are developed for the radiation-patterning tool to roughly produce the desired pattern when radiation is passed through the radiation-patterning tool. The profiles or elements form a rough correspondence to the desired pattern as the profiles or elements initially disregard the effects of interference of radiation passing through the radiation-patterning tool.

Following creation and verification of the design, an optical proximity correction process 112 is used to account for various interference factors that influence radiation passing through the radiation-patterning tool. Such interference factors may include constructive and destructive interference effects resulting as the radiation wavelength approximates the dimensions of portions of the profiles or elements of the radiation-patterning tool. In an optical proximity correction process, a geometry, such as a square or a rectangle, within a pattern layout may be adjusted to compensate for optical effects (e.g., optical, micro-loading, etch, resist, etc.) such that a resultant pattern more closely approximates the desired pattern. These adjustments are made based upon results of model-based simulations of the pattern layout at so-called "evaluation points," which are defined on the geometry to be adjusted.

As a result of the optical proximity correction process 112, a data set that corresponds to a pattern capable of generation by a radiation-patterning tool is typically generated. The data set is subsequently "taped out" to a radiation-patterning tool through the use of, for example, laser writing and/or electron-beam writing methodologies. Following the formation of the pattern on the radiation-patterning tool, the tool is capable of being utilized for semiconductor fabrication.

Conventionally, in an optical proximity correction process, the locations of the evaluation points are pre-determined through simple rules, such as by taking the mid-point of an edge of a geometry, or by considering other factors, such as the shape of the geometry. Unfortunately, these simple rules frequently do not select the optimal evaluation points for a given geometry.

There is a need for methods of enhancing a radiation-patterning process. Specifically, there is a need for methods of defining evaluation points for increased accuracy of optical proximity correction of a pattern in a radiation-patterning process.

DETAILED DESCRIPTION

In the following detailed description, reference is made to the accompanying drawings that form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the disclosure.

Specific implementations shown and described in this description are only examples and should not be construed as the only way to implement the present invention unless specified otherwise herein. For the most part, details concerning timing considerations, and the like, have been omitted where such details are not necessary to obtain a complete understanding of the present invention in its various embodiments and are within the abilities of persons of ordinary skill in the relevant art.

Referring in general to the following description and accompanying drawings, various aspects of the present invention are illustrated to show structure and method of operation of embodiments thereof. Common elements of the illustrated embodiments are designated with like numerals. It should be understood the figures presented are not meant to be illustrative of actual views of any particular portion of the actual structure or method, but are merely idealized representations, which are employed to more clearly and fully depict the present invention.

The term "photomask" traditionally is understood to refer to masks that define a pattern for an entirety of a wafer, and the term "reticle" is traditionally understood to refer to a patterning tool that defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized with their conventional meanings.

When executed as firmware or software, the instructions for performing the methods and processes described herein may be stored on a computer-readable medium. A computer-readable medium includes, but is not limited to, magnetic and optical storage devices such as disk drives, magnetic tape, CDs (compact discs), DVDs (digital versatile discs or digital video discs), and semiconductor devices such as RAM, DRAM, ROM, EPROM, and Flash memory.

Figure 1:
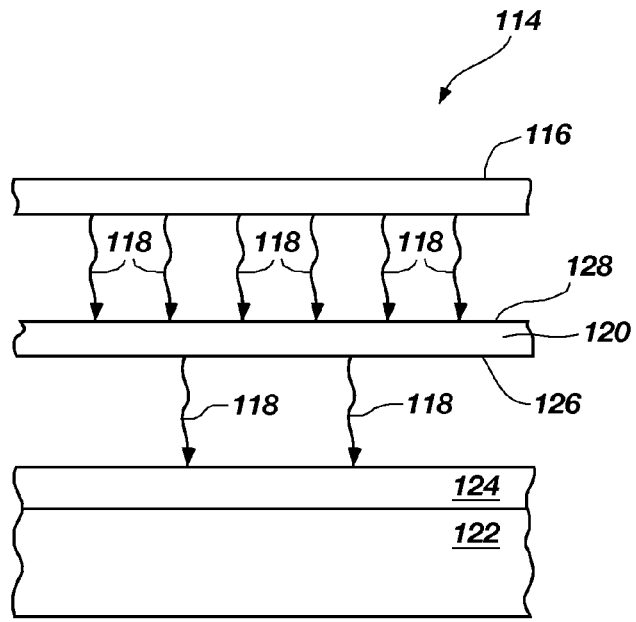
FIG. 1 is a cross-sectional view of a prior art apparatus utilized in printing a pattern on a radiation-sensitive material utilizing a radiation-patterning tool.
Figure 2:
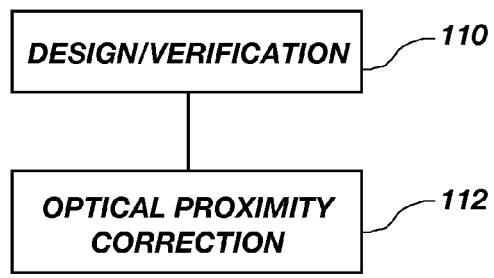
FIG. 2 is a flow chart of a prior art method of forming a radiation-patterning tool.

In the following description, the term "target geometry" is defined as a representative data set of a desired geometry within a target pattern layout that is to be formed on a semiconductor wafer. The term "simulated image" is an image produced during an optical proximity correction process simulation of a target geometry. The term "reticle geometry" is defined as a representative data set of a geometry within a reticle pattern layout to be formed on a radiation-patterning tool (i.e., radiation-patterning tool 120 illustrated in FIG. 1). The term "resultant image" is an actual image formed on a semiconductor wafer during photolithography.

For explanation purposes, an example of a conventional optical proximity correction process implementing evaluation points defined on a target geometry will first be described with reference to FIGS. 3A-3E. Thereafter, according to one or more embodiments of the present disclosure, a method of defining evaluation points and use of the evaluation points in an optical proximity correction process will be described in reference to FIGS. 4-5E.

As mentioned above, an optical proximity correction process may be implemented to compensate for interference effects that may occur when radiation passes through a radiation tool and exits out onto a radiation-sensitive material. More specifically, an optical proximity correction process may iteratively adjust a geometry within a target pattern layout in order to minimize some measure of the difference between the target geometry and a simulated geometry predicted by a model. Adjustment of a geometry is usually done by moving one or more segments of the geometry. Therefore, in order to adjust a geometry, dissection points are initially defined for the geometry. Between adjacent dissection points exists a line segment, wherein each line segment includes an evaluation point. After defining dissection points and evaluation points, the optical proximity correction process may calculate an error for each segment at a corresponding evaluation point. Each segment may then be moved, or biased independently by an amount based upon the deviation of a simulated image from the target geometry.

As known by one having ordinary skill in the art, producing a corner within a geometry, such as a rectangle, on a photoresist by photolithography has proven to be difficult due to interferences in small-scale printing. Commonly, the corners of a rectangular geometry print with a rounded pattern, and therefore, a resultant image formed on a semiconductor wafer may resemble a circle or an ellipse. To partially counteract these interferences, an optical proximity correction process may involve the use of modified geometries or adjacent sub-resolution geometries to improve imaging. An example of this, as described more fully below, is the use of a "serif" on one or more corners of a geometry.

Figure 3A:
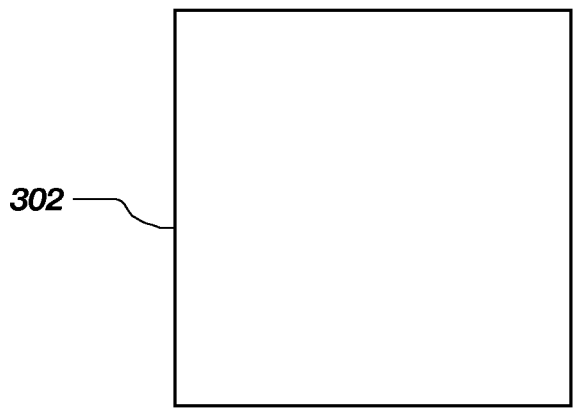
FIG. 3A illustrates a target geometry to be formed on a semiconductor wafer.
Figure 3B:
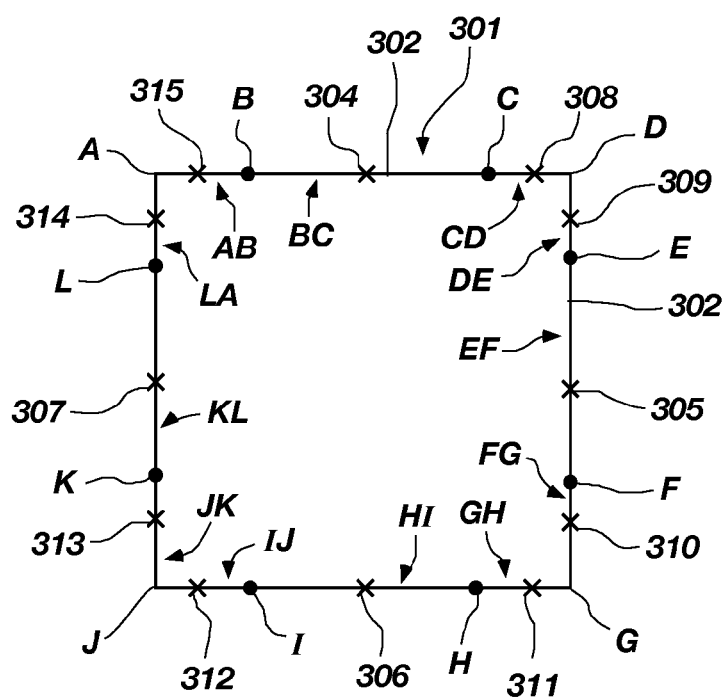
FIG. 3B illustrates the target geometry of FIG. 3A including dissection points and evaluation points used in an optical proximity correction process.

FIG. 3A illustrates a target geometry 302 that is to be formed on a semiconductor wafer (not shown). FIG. 3B illustrates target geometry 302 wherein dissection points A-L and line segments (AB, BC, CD, DE, EF, FG, GH, HI, IJ, JK, KL, and LA) have been defined. As illustrated in FIG. 3B, a line segment exists between two adjacent dissection points. Also, as illustrated, each edge of target geometry 302 includes three line segments. For example, a first edge 301 of target geometry 302 includes a first corner line segment AB existing between dissection point A and dissection point B, a mid-line segment BC existing between dissection point B and dissection point C, and another corner line segment CD existing between dissection point C and dissection point D.

Target geometry 302 also includes evaluation points 304-315, wherein each evaluation point is positioned in a corresponding line segment. Evaluation points 304-307 each lie in the middle of a corresponding mid-line segment. Therefore, for ease of description, evaluation points 304-307 will be hereinafter referred to as mid-points 304-307. Furthermore, evaluation points 308-315 each lie in a corresponding corner line segment. Therefore, for ease of description, evaluation points 308-315 will be hereinafter referred to as corner points 308-315. Subsequent to defining dissection points and evaluation points, simulations are performed at each mid-point 304-307 and at each corner point 308-315, and the corresponding line segments may be adjusted according to the difference between a simulated image and the target geometry. Conventionally, as mentioned above, evaluation points may be pre-determined by simple rules, such as by taking the mid-point of a corresponding line segment, or by considering other factors, such as the shape of the geometry to which the segment belongs.

Figure 3C:
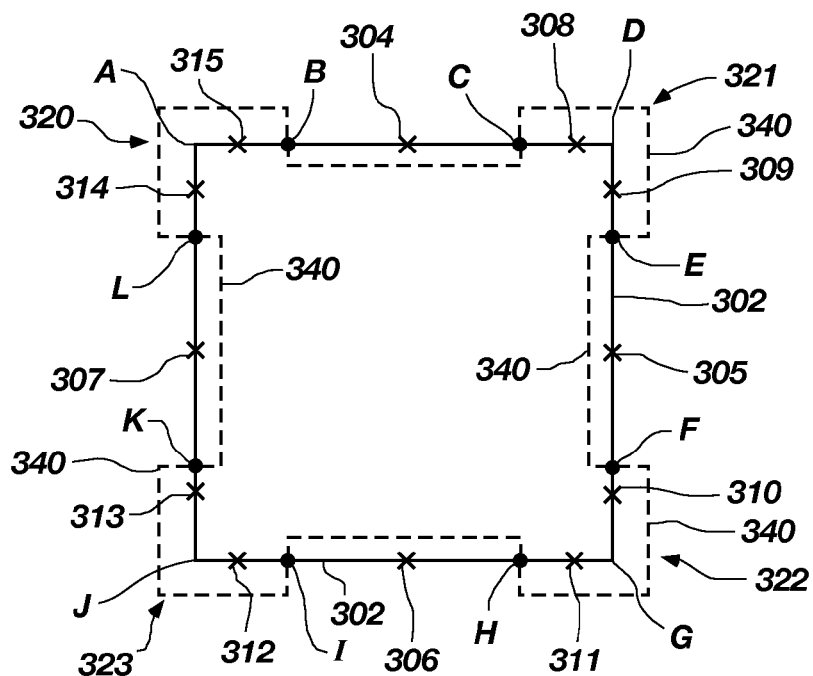
FIG. 3C illustrates the target geometry of FIGS. 3A and 3B and a reticle geometry to be formed on a radiation-patterning tool.

FIG. 3C illustrates a reticle geometry 340 created by an optical proximity correction process performed on target geometry 302. As illustrated in FIG. 3C, reticle geometry 340 includes serifs 320-323. Each serif 320-323 is a result of two line segments, which are adjacent to a corner of target geometry 302, being adjusted outwardly with respect to target geometry 302 during the optical proximity correction process. For example, serif 323 is a result of line segment IJ and line segment JK being adjusted outwardly with respect to target geometry 302. As illustrated in FIG. 3C, line segments BC, EF, HI, and KL have each been adjusted in an inward direction with respect to target geometry 302 during the optical proximity correction process. Reticle geometry 340 is shown by itself in FIG. 3D. Reticle geometry 340 may then be "taped out" to a radiation-patterning tool, which may then be used during photolithography.

Figure 3D:
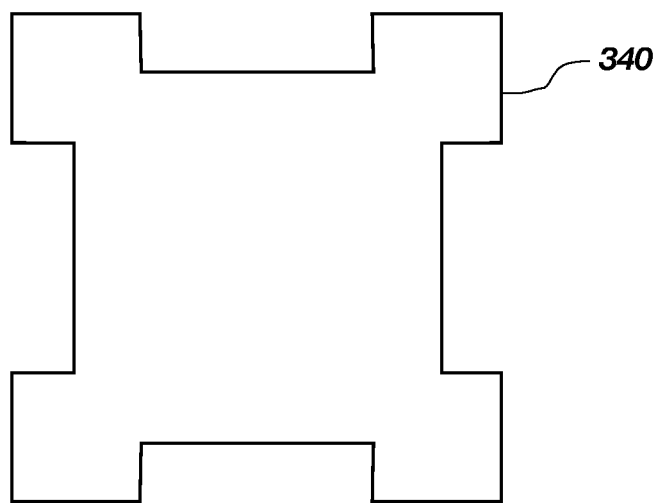
FIG. 3D illustrates the reticle geometry of FIG. 3C.
Figure 3E:
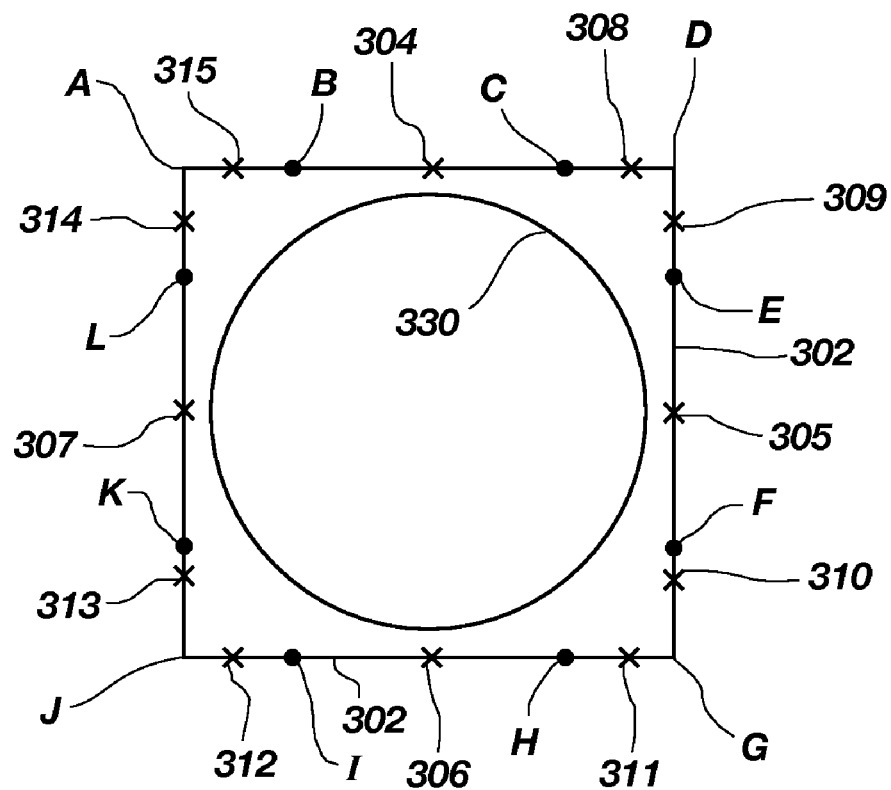
FIG. 3E illustrates the target geometry of FIGS. 3A and 3B and a resultant image formed on a semiconductor wafer during photolithography.

FIG. 3E illustrates target geometry 302 and a resultant image 330 formed during fabrication of an integrated circuit using reticle geometry 340 (see FIGS. 3C and 3D). As illustrated, during photolithography, the corners of target geometry 302 print as a rounded pattern. In addition to printing as a rounded pattern, the contour of resultant image 330 tends to deviate from target geometry 302, especially adjacent to corner points 308-315. This error is due to the fact that corner points 308-315 lack a direct correlation to the contour of resultant image 330.

In accordance with one or more embodiments of the present disclosure, a method of defining evaluation points and use of the evaluation points within an optical proximity correction method will now be described with reference to FIG. 4 and FIGS. 5A-5E. Initially, at act 508, a system (e.g., a computer) may receive a target geometry requiring optical proximity correction. Furthermore, the system may receive optical proximity correction parameters (including dissection points and evaluation points) for evaluating the target geometry. At act 510 (see FIG. 4), the target geometry is divided into line segments and one evaluation point is placed in each line segment by conventional methods known in the art.

Figure 5A:
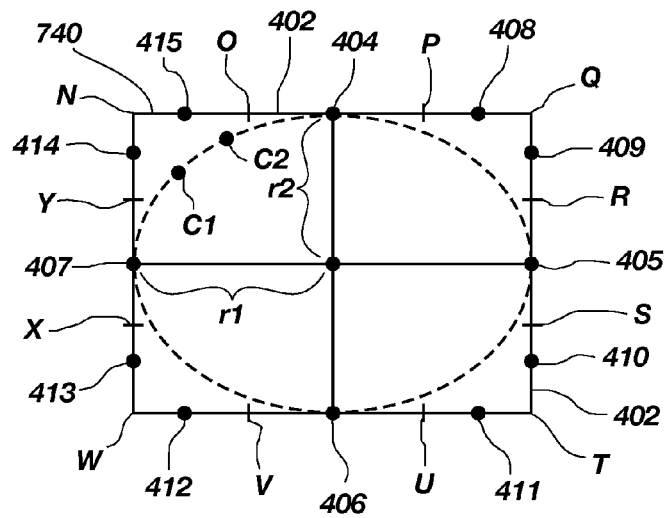
FIG. 5A illustrates a target geometry including dissection points and evaluation points used in an optical proximity correction process, according to an embodiment of the present invention.

FIG. 5A illustrates a target geometry 402 wherein dissection points N-Y and line segments (NO, OP, PQ, QR, RS, ST, TU, UV, VW, WX, XY, YN) have been defined. Although target geometry 402 is illustrated as an oblong geometry, target geometry 402 may comprise any rectangular geometry (e.g., a square). Furthermore, although target geometry 402 is shown as having dissection points N-Y, a target geometry having any number of dissection points, and thus, any number of line segments is within the scope of an embodiment of the present disclosure. Similar to target geometry 302 illustrated in FIG. 3B, target geometry 402 includes evaluation points 404-415, each positioned within a corresponding line segment. Evaluation points 404-407 each lay in the middle of a corresponding mid-line segment. Therefore, for ease of description, evaluation points 404-407 may also be hereinafter referred to as mid-points 404-407. Furthermore, evaluation points 408-415 each lay in a corresponding corner line segment. Therefore, for ease of description, evaluation points 408-415 may also be hereinafter referred to as corner points 408-415.

At act 512, a contour of a predicted image (i.e., an image to be produced during an optical proximity correction simulation) may be predicted. A contour of an image may be predicted at least partially based on an assumption that the contour should pass through each mid-point 404-407 and by knowing the radius of curvature of the image at each mid-point 404-407. More specifically, because it may be desirable for a predicted image to have a contour which passes through each mid-point 404-407, the radius of curvature of the predicted image at each mid-point 404-407 may first be determined. Thereafter, a contour of the predicted image may be determined using the radius of curvature of the predicted image at each mid-point 404-407. Conventionally, lithography of large shapes (i.e., L>>r, where L is a length of a side of a square, or the shorter side of a rectangle and r is the radius of a simulated image) requires minimal or no optical proximity corrections, and, therefore, it should be noted that this disclosure focuses on target geometries that are small compared to the wavelength of the light in the illumination system (e.g., r~L/2).

Figure 6:
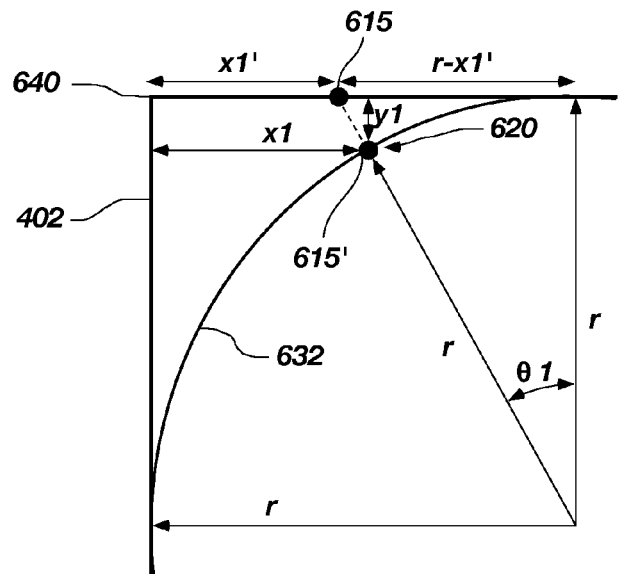
FIG. 6 illustrates a square target geometry and a shifted evaluation point, in accordance with an embodiment of the present invention.
Figure 8:
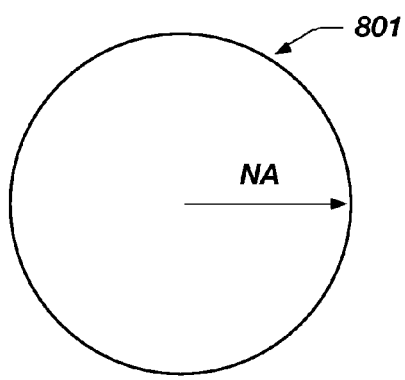
FIG. 8 illustrates a circular lens with an acceptance angle, in accordance with an embodiment of the present invention.

For example, in an embodiment wherein target geometry 402 comprises a rectangle having a width equal to its length (i.e., a square), a predicted image should comprise a circle and, therefore, the radius of curvature of the predicted image should be consistent throughout. Initially, a minimum radius of curvature may be predicted based on a measure of resolution of an illumination system. For example, a minimum radius of curvature may be approximated by an imaging theory (e.g., Hopkins Equation) or by the following equation:

$$r = \lambda / [2 * NA * (1 + \sigma)]; \quad (1)$$

wherein r is the minimum radius of curvature of the predicted image, σ is the partial coherence, λ is the wavelength of the illumination light, and NA is the numerical aperture of the illumination system utilized in the photolithographic process. It should be noted that in the derivation of equation (1), it is assumed that a pupil shape of each lens 801 within the illumination system utilized is circular with an acceptance angle of NA, as illustrated in FIG. 8. Furthermore, it is assumed that the illumination system is free from aberrations. Thereafter, according to one embodiment of the present disclosure, an image may be predicted using the dimensions of target geometry 402 (i.e., the length and width). Therefore, by knowing the radius of curvature of the predicted image at mid-points 404-407, the contour of a predicted image may be determined. After determining a contour of a predicted image having a consistent radius of curvature, each corner point 408-415 may be moved to an associated location on the contour. For example, as illustrated in FIG. 6, a corner point 615' may be created by moving corner point 615 to an associated location 620 on contour 632. Associated location 620 defined by (x1, y1) may be determined by the following equations:

$$\text{theta1} = \arctan[(r-x1)/rJ; \quad (2)$$

$$x1 = r*(1-\text{sine}(\text{theta1})); \quad (3)$$

$$y1 = r*(1-\text{cosine}(\text{theta1})); \quad (4)$$

wherein r is the minimum radius of curvature of the predicted image solved for above in equation (1), theta1 is an angle of displacement from the vertical axis, and x1' is the distance from corner point 615 to a corner 640 of the target geometry 402.

Figure 7:
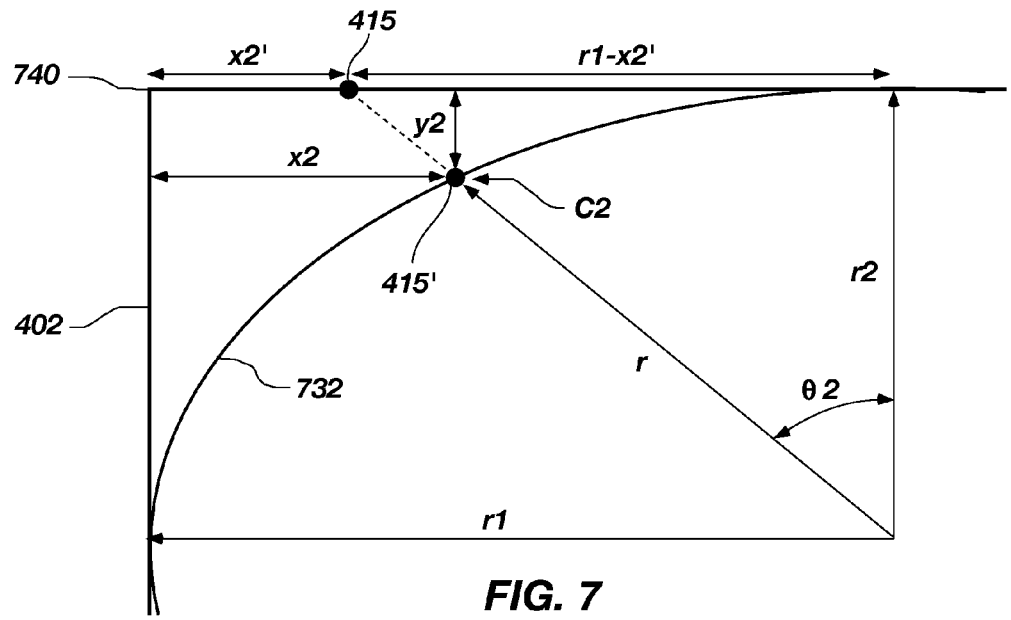
FIG. 7 illustrates an oblong target geometry and a shifted evaluation point, according to an embodiment of the present invention.

Furthermore, in an embodiment wherein target geometry 402 comprises an oblong (e.g., a rectangle having a width that is unequal to its length), the location of one or more points along a contour of a predicted image and adjacent to a corner of target geometry 402 may be determined based on the radii of curvature of the two mid-points adjacent to the corner. For example, in reference to FIG. 5A, by knowing the values of a radius r1 and a radius r2, the radius of curvature at each mid-point 407 and 404 may be determined. Furthermore, by knowing the radius of curvature at each mid-point 407 and 404, the locations of one or more points (i.e., C1 and C2) along a contour of the predicted image and adjacent to a corner 740 of the target geometry 402 may be calculated. For example, as illustrated in FIG. 7, a corner point 415' may be created by moving corner point 415 to an associated location C2 on contour 732. Associated location C2 defined by (x2, y2) may be determined by the following equations:

$$\text{theta2} = \arctan[(r1-x2')/r2] = \arctan[(r1-x2)/(r2-y2)]; \quad (5)$$

$$[(r1-x2')/r2] = [(r1-x2)/(r2-y2)]); \quad (6)$$

$$[(r1-x2)/r1]^2 + [(r2-y2)/r2]^2 = 1; \quad (7)$$

wherein r1 is half the distance of the larger rectangle side of the target geometry 402, r2 is half the distance of the smaller rectangle side of the target geometry, x2' is the distance from corner point 415 to a corner 740 of the target geometry, and theta2 is an angle of displacement from the vertical axis. Specifically, as known by a person of ordinary skill in the art, variables x2 and y2 may then be solved for from equations (6) and (7) to determine a location of associated location C2.

Figure 5B:
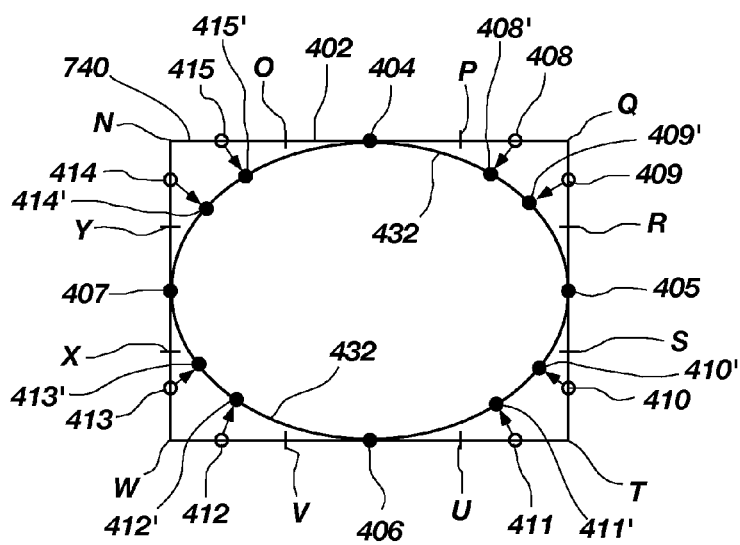
FIG. 5B illustrates the target geometry of FIG. 5A and a predicted image having evaluation points defined thereon, in accordance with an embodiment of the present invention.
Figure 5C:
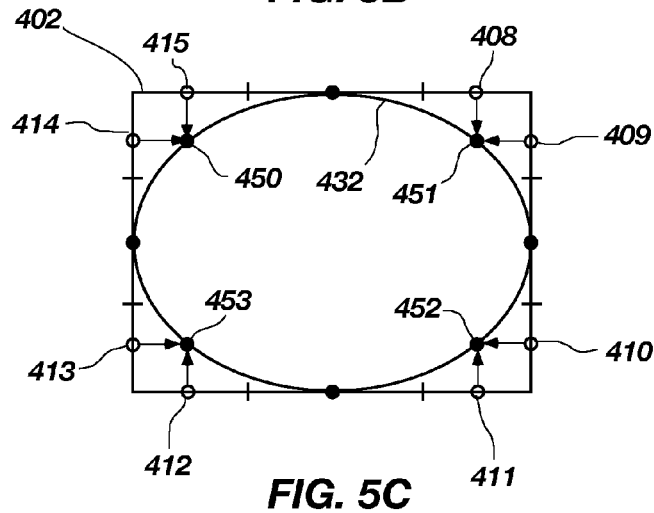
FIG. 5C illustrates the target geometry of FIG. 5A and a predicted image having mid-point evaluation points and merged corner evaluation points defined thereon, in accordance with an embodiment of the present invention.

FIG. 5B illustrates target geometry 402 and a predicted image 432. After calculating the location of one or more points along the predicted image 432, at act 514, and as illustrated in FIG. 5B, each corner point 408-415 may be moved to the associated determined points on predicted image 432 to create corner points 408'-415'. More specifically, for example only, after determining the location of two points between adjacent mid-points 404 and 405 and along predicted image 432, corner points 408 and 409 may each be moved to the location of the associated determined points on predicted image 432 to create corner points 408' and 409', respectively. Furthermore, as illustrated in FIG. 5C, according to an embodiment of the present disclosure, two or more adjacent corners points on target geometry 402 may be shifted to a single associated determined point on predicted image 432 to create a single evaluation point. More specifically, corner points 414 and 415 may be shifted and merged to form corner point 450, corner points 408 and 409 may be shifted and merged to form corner point 451, corner points 410 and 411 may be shifted and merged to form corner point 452, and corner points 412 and 413 may be shifted and merged to form corner point 453.

Figure 4:
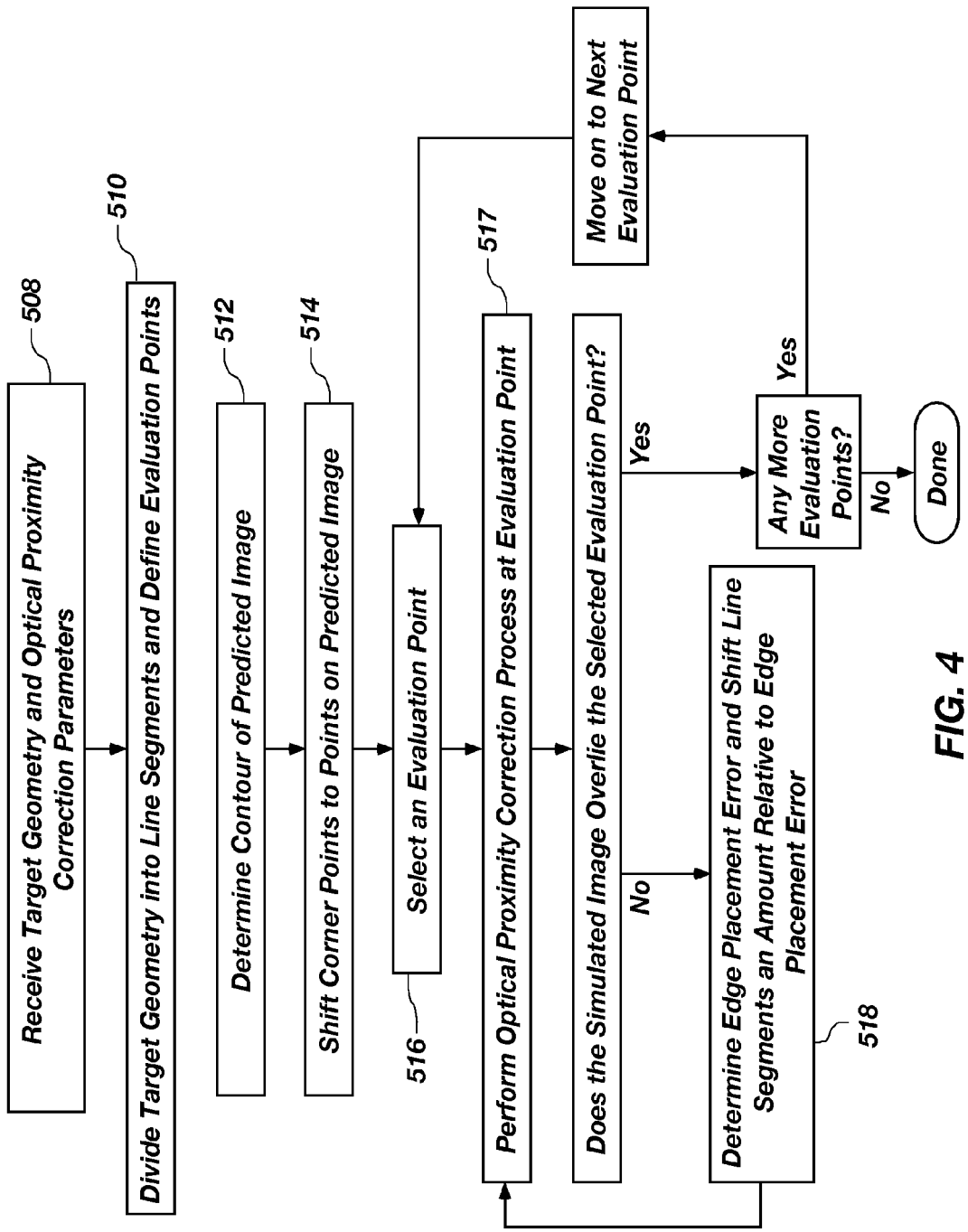
FIG. 4 is a flow diagram illustrating a method of defining evaluation points and use of the evaluation points in an optical proximity correction process, in accordance with an embodiment of the present invention.

Subsequently, at act 516, an evaluation point overlying predicted image 432 may be selected and an optical proximity correction process may then be performed on the selected evaluation point at act 517. If the image simulated during optical proximity correction does not overlie the selected evaluation point, then, at act 518, the optical proximity correction process may determine an edge placement error, which is the distance between the selected evaluation point and a simulated image (an image produced during simulation in an optical proximity correction process). Thereafter, also at act 518, the line segment corresponding to the selected evaluation point may be displaced by an amount relative to the edge placement error. As an example, with reference to FIG. 5B, in optical proximity correction using corner point 414', line segment YN may be displaced by an amount relative to an edge placement error calculated between corner point 414' and a simulated image. For example, the line segment corresponding to the selected evaluation point may be displaced by an amount equal to the edge placement error or the line segment may be moved by a percentage of an amount equal to the edge placement error. As illustrated in FIG. 4, acts 517 and 518 are repeated until the contour of the simulated image overlies the selected evaluation point. Furthermore, as illustrated in FIG. 4, acts 516, 517, and 518 are performed for each mid-point 404-407 and each corner point 408'-415', or in the case adjacent corner points are merged, corner points 450-453 (FIG. 5C).

It may be desirable that after an optical proximity correction process is performed at each mid-point 404-407 and each corner point 408'-415'/450-453, the contour of the simulated image will overlie each mid-point 404-407 and each corner point 408'-415'/450-453. Because it may not always be possible to produce a simulated image having a contour overlying each mid-point 404-407 and each corner point 408'-415'/450-453, each mid-point 404-407 and each corner point 408'-415'/450-453 may be scaled, or in other words, a specific weight may be assigned to each mid-point 404-407 and each corner point 408'-415'/450-453. As a result, it may be possible to assign each mid-point 404-407 a higher weight than each corner point 408'-415'/450-453 and, thus, ensure that a contour of a simulated image overlies each mid-point 404-407. For example only, and not by way of limitation, each mid-point 404-407 may be scaled to 100% and each corner point 408'-415'/450-453 may be scaled to a value less than 100% (i.e., 50%).

Figure 5D:
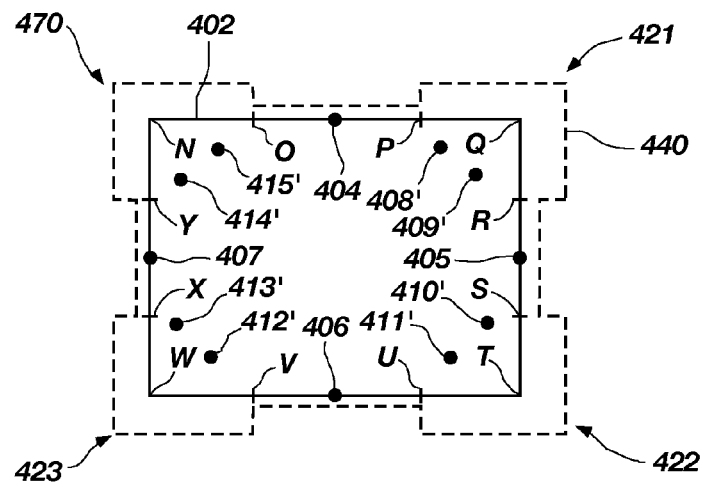
FIG. 5D illustrates the target geometry of FIGS. 5A and 5B and a reticle geometry to be formed on a semiconductor wafer, according to an embodiment of the present invention.
Figure 5E:
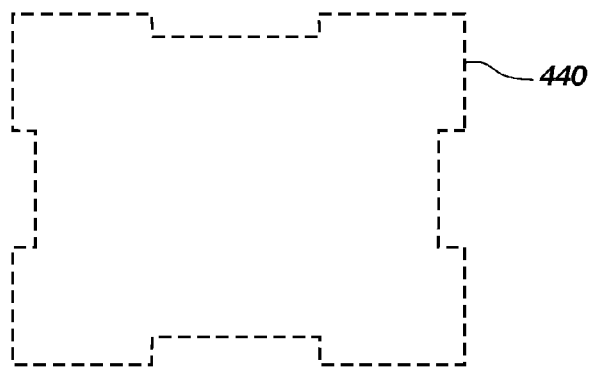
FIG. 5E illustrates the reticle geometry shown in FIG. 5D.

FIG. 5D illustrates a reticle geometry 440 created by an optical proximity correction process performed on target geometry 402 at mid-points 404-407 and corner points 408'-415'. As illustrated in FIG. 5D, reticle geometry 440 includes serifs 420-423. Each serif 420-423 is a result of two line segments that are adjacent to a corner of target geometry 402 being adjusted outwardly with respect to target geometry 402 during an optical proximity correction process. For example, serif 423 is a result of line segment VW and line segment WX being adjusted outwardly with respect to target geometry 402 during the optical proximity correction process. Furthermore, as illustrated in FIG. 5D, line segments XY, OP, RS, and UV have each been adjusted in an outward direction with respect to target geometry 402 during the optical proximity correction process. Reticle geometry 440 is shown by itself in FIG. 5E. Reticle geometry 340 may then be "taped out" to a radiation-patterning tool, which may then be used during photolithography. The shape of reticle geometry 440 shown in FIGS. 5D and 5E is just an example of a possible shape of a reticle geometry and is not intended in any way to limit the scope of any embodiment of the present disclosure.

Figure 5F:
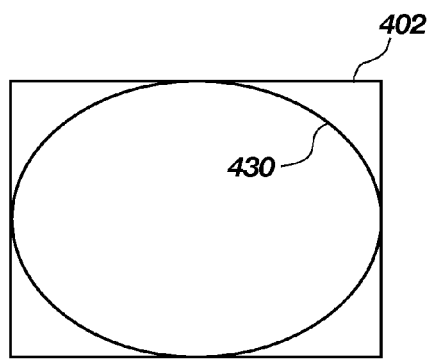
FIG. 5F illustrates the target geometry of FIGS. 5A-5C and a resultant image formed on a semiconductor wafer, in accordance with an embodiment of the present disclosure.

FIG. 5F illustrates target geometry 402 and a resultant image 430 formed during fabrication of an integrated circuit using reticle geometry 440 (see FIGS. 5C and 5D). Although, as illustrated, during fabrication the corners of target geometry 402 print as a rounded pattern, resultant image 430 exhibits less deviation from target geometry 402 than the deviation of resultant image 330 from target geometry 302, as illustrated in FIG. 3E.

Specific embodiments have been shown by way of non-limiting example in the drawings and have been described in detail herein; however, the various embodiments may be susceptible to various modifications and alternative forms. It should be understood that the invention is not limited to the particular forms disclosed. Rather, the invention encompasses all modifications, equivalents, and alternatives falling within the scope of the following appended claims and their legal equivalents.

What is claimed is:

1. A method of defining evaluation points for use in optical proximity correction of a target geometry, comprising:
   predicting at least one point on a predicted image from a computer simulation of an optical proximity correction of a target geometry of a patterning tool, the target geometry having a plurality of pre-defined line segments and a plurality of evaluation points used in the computer simulation of the optical proximity correction, each line segment of the plurality having at least one evaluation point of the plurality defined thereon; and
   replacing at least one evaluation point of the plurality of evaluation points with the at least one point on the predicted image, the at least one point on the predicted image being defined as an evaluation point for use in an optical proximity correction operation.

2. The method of claim 1, further comprising predicting at least one additional point on the predicted image at an evaluation point that overlies a mid-point of an edge of the target geometry, the at least one additional point on the predicted image being defined as another evaluation point for use in the optical proximity correction operation.

3. The method of claim 2, wherein predicting the at least one point on the predicted image comprises predicting the at least one point at a location between two mid-points of adjacent edges of the target geometry, the location being based at least partially on a radius of curvature at each of the two mid-points of adjacent edges of the target geometry.

4. The method of claim 3, wherein predicting the at least one point on the predicted image further comprises predicting the at least one point at the location between two mid-points of adjacent edges of the target geometry, the location being based at least partially upon at least one configuration variable of an illumination system to be utilized to perform a photolithography operation.

5. The method of claim 4, wherein the at least one configuration variable of the illumination system includes at least one of a numerical aperture of the illumination system, a shape of one or more lenses within the illumination system, a radius of a light source within the illumination system, and a wavelength of a light transmitted by the illumination system.

6. The method of claim 1, wherein the target geometry comprises one of a square geometry and an oblong geometry.

7. The method of claim 1, wherein the predicted image comprises one of a circle and an ellipse.

8. The method of claim 1, wherein the plurality of evaluation points used in the computer simulation of the optical proximity correction includes a plurality of corner points, wherein each line segment adjacent a corner of the target geometry comprises at least one corner point of the plurality.

9. The method of claim 8, wherein replacing the at least one evaluation point comprises replacing at least one corner point of the plurality with the at least one point on the predicted image.

10. The method of claim 9, wherein replacing the at least one corner point comprises replacing two corner points with a single point as the at least one point on the predicted image, the two corner points previously being defined on adjacent line segments forming a corner of the target geometry.

11. The method of claim 1, wherein predicting the at least one point on the predicted image comprises predicting the at least one point based at least partially on dimensions of the target geometry and at least partially on at least one configuration variable of an illumination system to be utilized to perform a photolithography operation.

12. The method of claim 11, wherein the at least one configuration variable of the illumination system includes at least one of a numerical aperture of the illumination system, a shape of one or more lenses within the illumination system, a radius of a light source within the illumination system, and a wavelength of a light transmitted by the illumination system.

13. A computer-readable media having instructions stored thereon that when executed by a processor cause the processor to perform a method for positioning evaluation points for use in optical proximity correction of a target geometry, the method comprising:
   predicting a contour of an image of an optical proximity correction simulation of a target geometry, the target geometry having a plurality of line segments and a plurality of evaluation points, each line segment of the plurality having at least one evaluation point of the plurality defined thereon; and
   replacing at least one evaluation point of the plurality with an associated location on the predicted contour, the associated location on the predicted contour defined as one of the plurality of evaluation points for use the optical proximity correction of the target geometry.

* * * * *